US007622832B2

(12) United States Patent
Moriyama

(10) Patent No.: US 7,622,832 B2
(45) Date of Patent: Nov. 24, 2009

(54) LINEAR MOTOR AND LINEAR MOVING STAGE DEVICE

(75) Inventor: Tsuyoshi Moriyama, Kanagawa (JP)

(73) Assignee: Toshiba Kikai Kabushiki Kaisha, Tokyo (JP)

( * ) Notice: Subject to any disclaimer, the term of this patent is extended or adjusted under 35 U.S.C. 154(b) by 107 days.

(21) Appl. No.: 11/218,737

(22) Filed: Sep. 6, 2005

(65) Prior Publication Data

US 2006/0049700 A1 Mar. 9, 2006

(30) Foreign Application Priority Data

Sep. 6, 2004 (JP) ............................ 2004-258878

(51) Int. Cl.
*H02K 41/00* (2006.01)

(52) U.S. Cl. ........................................................ 310/12

(58) Field of Classification Search .............. 310/12–14
See application file for complete search history.

(56) References Cited

U.S. PATENT DOCUMENTS

| | | | | | |
|---|---|---|---|---|---|
| 4,714,849 | A * | 12/1987 | Yamamoto et al. | ............ | 310/12 |
| 5,701,042 | A * | 12/1997 | Takei | .......................... | 310/12 |
| 5,723,917 | A * | 3/1998 | Chitayat | ...................... | 310/12 |
| 5,783,877 | A * | 7/1998 | Chitayat | ...................... | 310/12 |
| 5,998,889 | A * | 12/1999 | Novak | ......................... | 310/12 |
| 5,998,890 | A * | 12/1999 | Sedgewick et al. | ............ | 310/12 |
| 6,114,781 | A * | 9/2000 | Hazelton et al. | .............. | 310/12 |
| 6,140,734 | A * | 10/2000 | Hazelton et al. | ............ | 310/198 |
| 6,515,381 | B1 * | 2/2003 | Novak et al. | .................. | 310/12 |
| 6,664,665 | B2 * | 12/2003 | Hsiao | .......................... | 310/12 |
| 2002/0047314 | A1 * | 4/2002 | Takedomi | .................... | 310/12 |
| 2003/0111915 | A1 * | 6/2003 | Baccini | ....................... | 310/12 |

FOREIGN PATENT DOCUMENTS

JP 2003-116262 4/2003

* cited by examiner

*Primary Examiner*—Quyen Leung
*Assistant Examiner*—Alex W Mok
(74) *Attorney, Agent, or Firm*—Pillsbury Winthrop Shaw Pittman, LLP

(57) ABSTRACT

A linear motor for giving thrust to a movable unit capable of linearly moving freely in one direction with respect to a stator, comprising a plurality of permanent magnets arranged on the base side by lining up a positive pole and a negative pole in the one direction; and a plurality of flat shaped coils arranged along the arrangement direction of permanent magnets and fixed as armatures to said movable unit side so as to face the permanent magnets by leaving an electromagnetic gap; wherein a coil fixed surface on the stage side is provided a recessed portion for defining an air gap between the coil fixed surface and said coils.

14 Claims, 11 Drawing Sheets

LINEAR MOTOR AND LINEAR MOVING STAGE DEVICE

CROSS REFERENCES TO RELATED APPLICATIONS

The present invention contains subject matter related to Japanese Patent Application JP 2004-258878 filed in the Japanese Patent Office on Sep. 6, 2004, the entire contents of which being incorporated herein by reference.

BACKGROUND OF THE INVENTION

1. Field of the Invention

The present invention relates to a linear motor for giving thrust of free linear movement in one direction and a linear moving stage device capable of moving a stage by the provided linear motor.

2. Description of the Related Art

There are a movable magnet type and a movable coil type in a coreless linear motor of the related art. In the movable magnet type linear motor, coils have to be arranged on corresponding parts on the power supply side (primary side) over the almost all area of a movable stroke on the magnet side (secondary side). Therefore, the movable magnet type linear motor is liable to be an expensive device.

On the other hand, the movable coil type linear motor does not have such a disadvantage and is superior in that point.

As the movable coil type linear motor, those having a flat (approximately track shaped) coil as an armature fitted into a movable body attaching plate between magnets arranged to be facing to each other and arranged on both sides in the thickness direction of the movable body attaching plate are known (for example, Japanese Unexamined Patent Publication (Kokai) No. 2003-116262).

FIG. 10 is a view of the configuration of a coreless linear motor described in the patent publication, seen from a section perpendicular to a longitudinal direction (moving direction) thereof. FIG. 11 is a perspective view of a reinforcement member to be fixed to the movable body attaching plate and a coil to be fixed by being fitted in the reinforcement member.

The coreless linear motor 100 shown in FIG. 10 has a side yoke 101 having a recessed cross section, and permanent magnet series 104 and 105 are provided on facing surfaces of an upper piece (an upper side yoke 102) and a lower piece (a lower side yoke 103) of the side yoke 101. At this time, magnets composing the permanent magnet series 104 and 105 are lined up in the longitudinal direction (motor moving direction) of the side yoke 101, so that their magnetic polarities become opposite from that of adjacent magnet and the magnetic polarities of facing magnets on the upper side yoke side and the lower side yoke side become different. Between the facing permanent magnetic series 104 and 105, the movable body attaching plate 106 to be attached with a movable body on its open end side is inserted and reinforcement members 108 respectively mounted with coils 107 are fixed to the both sides in the thickness direction.

The reinforcement member 108 has an approximate flat shape as shown in FIG. 11 and composed of a nonmagnetic material, such as a resin. Annular grooves 108A to be almost fitted in with a shape of the hollow coils 107 are formed on one of the main surfaces (surface facing to the magnets) of the reinforcement member 108. On the reinforcement member 108 for a three-phase coil motor shown in FIG. 11, three annular grooves 108A are formed along the motor moving direction A and each of the hollow coils 107 is fitted in each of the annular grooves 108A. A raised part 108B corresponding to a coil bobbin is formed at an approximately center portion of the annular groove 108A in advance, and a hollow part 107A of the coil fits with the raised part 108B. As a result, each of the coils 107 after being mounted is in a state that much of the surfaces except for the magnetic facing surface are enclosed by a resin or other nonmagnetic material.

The reinforcement members 108 attached with the coils 107 are fixed to both sides in the thickness direction of the movable body attaching plate 106 and inserted to a space between facing magnets in the side yoke 101 as shown in FIG. 10. While not illustrated, the movable body attaching plate 106 at this time is supported to be linearly movable freely by the side yoke 101 or a not shown base for the side yoke 101 to be fixed to.

When a three-phase AC current flows to the three coils 107 as armatures, a Lorentz force due to magnetic strength and electric strength affects an assembled body, that is, the movable body attaching plate 106, coils 107 and reinforcement elements 108, as a movable unit for being attached with a movable body and generates thrust of a linear motor.

The movable coil type coreless linear motor can be variously used as a compact linear moving stage device to be incorporated, for example, in working machines and a variety of production apparatuses, etc. In that case, the device is demanded to be compact and to attain high control performance and low power consumption.

The coreless linear motor 100 having the configuration shown in FIG. 10, however, has disadvantages to be overcome explained below, for example, when being applied to a linear moving stage device.

In the linear motor configuration shown in FIG. 10, flat shaped coils 107 face to the permanent magnet series 104 and 105. The coils 107, the permanent magnet series 104 or 105, the upper side yoke 102 and the lower side yoke 103 compose a magnetic circuit. But it is difficult to attain a thin body with this configuration because of the points (1) to (4) below.

(1) As shown in FIG. 10, two coils 107 are arranged in the thickness direction, and each coil 107 has to face to the permanent magnetic series 104 or 105 by leaving a desired magnetic gap.

(2) When seeing the upper side yoke 102 and the lower side yoke 103 in the thickness direction, the yoke of a magnetic circuit has to be provided by the number of 2. The upper side yoke 102 and the lower side yoke 103 have to have a certain thickness so as not to cause magnetic saturation. Note that, even in the case where an affect by magnetic saturation is small and the yoke can be made thin to a certain extent, strong attractive forces of magnets act between the upper side yoke 102 and the lower side yoke 103 and there is a mechanical limit in the strength, so that the yokes have to have a certain thickness.

(3) In terms of mechanical strength, the movable body attaching plate 106 has to be also made thick to a certain extent.

(4) When placing a stage (not shown) at an upper position than the upper side yoke 102, an air gap has to be secured between the stage and the upper side yoke 102 because the upper side yoke 102 is fixed.

From the above points (1) to (4), the linear motor 100 itself configured as shown in FIG. 10 is thick, so that when it is applied to a linear moving stage device, there is a disadvantage that the linear moving stage device is hard to be made thin due to the configuration.

A bobbin of the coils 107 is made by a resin, etc. and much of the surfaces except for the magnet facing surface are enclosed by the reinforcement members 108 made by a resin, etc. as shown in FIG. 11, so that the thermal radiation characteristic is poor and an overheat state is liable to be caused when a current flows to the coils 107. Therefore, it is not possible to flow a large amount of current to the coils 107, consequently, the magnetic field has to be intensified, so that a thickness of the magnets composing the permanent magnet series 104 and 105 and a thickness of the yokes (the upper side yoke 102 and the lower side yoke 103), etc. tend to be thick.

A distance from a mounting portion of the coils 107 to a point of applying the thrust (that is, a stage position) is long and, moreover, the thrust is transmitted to the stage via the movable body attaching plate 106 having an L-shaped cross section, so that couple of forces to induce vibration particularly in the yawing direction is easily generated to hinder the performance of the stage. Therefore, a decline of a control gain is caused, and a decline of stability of a stage speed, a decline of a settlement time when aligning the stage, and a decline of holding accuracy become disadvantageous.

SUMMARY OF THE INVENTION

According to the present invention, the number of parts, such as coils and magnets, can be reduced, and a limit in the mechanical strength caused by attractive forces between magnets can be eliminated, moreover, a thin linear motor can be provided by attaining sufficient thermal radiation of the coils and eliminating necessity of intensifying the magnetic field.

Also, according to the present invention, after mounting a thin body in the same way as in the above linear motor, a distance from the mounting portion of the coils to a point of applying the thrust is made short, and generation of couple of forces is constrained by transmitting the thrust directly to the stage, as a result, a thin linear moving stage device having a high control gain is provided.

According to the present invention, there is provided a linear motor for giving thrust to a movable unit capable of linearly moving freely in one direction with respect to a stator, including a plurality of permanent magnets arranged on the stator side by lining up a positive pole and a negative pole in the one direction; and a plurality of flat shaped coils arranged along the arrangement direction of permanent magnets and fixed as armatures to the movable unit side so as to face the permanent magnets by leaving an electromagnetic gap; wherein a coil fixed surface on the movable element side is provided with a recessed portion for defining an air gap between the coil fixed surface and the coils.

According to the present invention, there is provided a linear moving stage device including a base, a stage built to be able to linearly move freely in one direction with respect to the base, and a linear motor for giving thrust in the one direction to the stage, wherein the linear motor includes a plurality of permanent magnet arranged on the base by lining up a positive pole and a negative pole in the one direction, and a plurality of flat shaped coils arranged along the arrangement direction of permanent magnets and fixed as armatures to the stage so as to face the permanent magnets by leaving an electromagnetic gap; wherein a coil fixed surface on the stage side is provided with a recessed portion for defining an air gap between the coil fixed surface and the coils.

The linear motor of the present invention has advantages that the number of parts, such as coils and magnets, can be reduced, a limit in the mechanical strength due to attractive forces between magnets can be eliminated, and a thin body is attained by securing sufficient thermal radiation of the coils and eliminating the necessity of intensifying the magnetic field.

Also, in addition to the same advantages as those of the above linear motor, the linear moving stage device of the present invention has advantages that a distance from the mounting portion of the coils to the thrust applying point (a stage position) is made short and the thrust is transmitted directly to the stage to constrain generation of an incidental force, consequently, the control gain becomes high.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, a linear moving stage device according to embodiments of the present invention and a linear motor for giving the driving force will be explained with reference to the drawings. Here, the case of moving along one axis will be mainly explained but, in the present invention, a linear moving stage device capable of attaining two-axis moving (an X-Y axes table device) can be realized by combining linear moving tables configured as below.

First Embodiment

Figure 1:
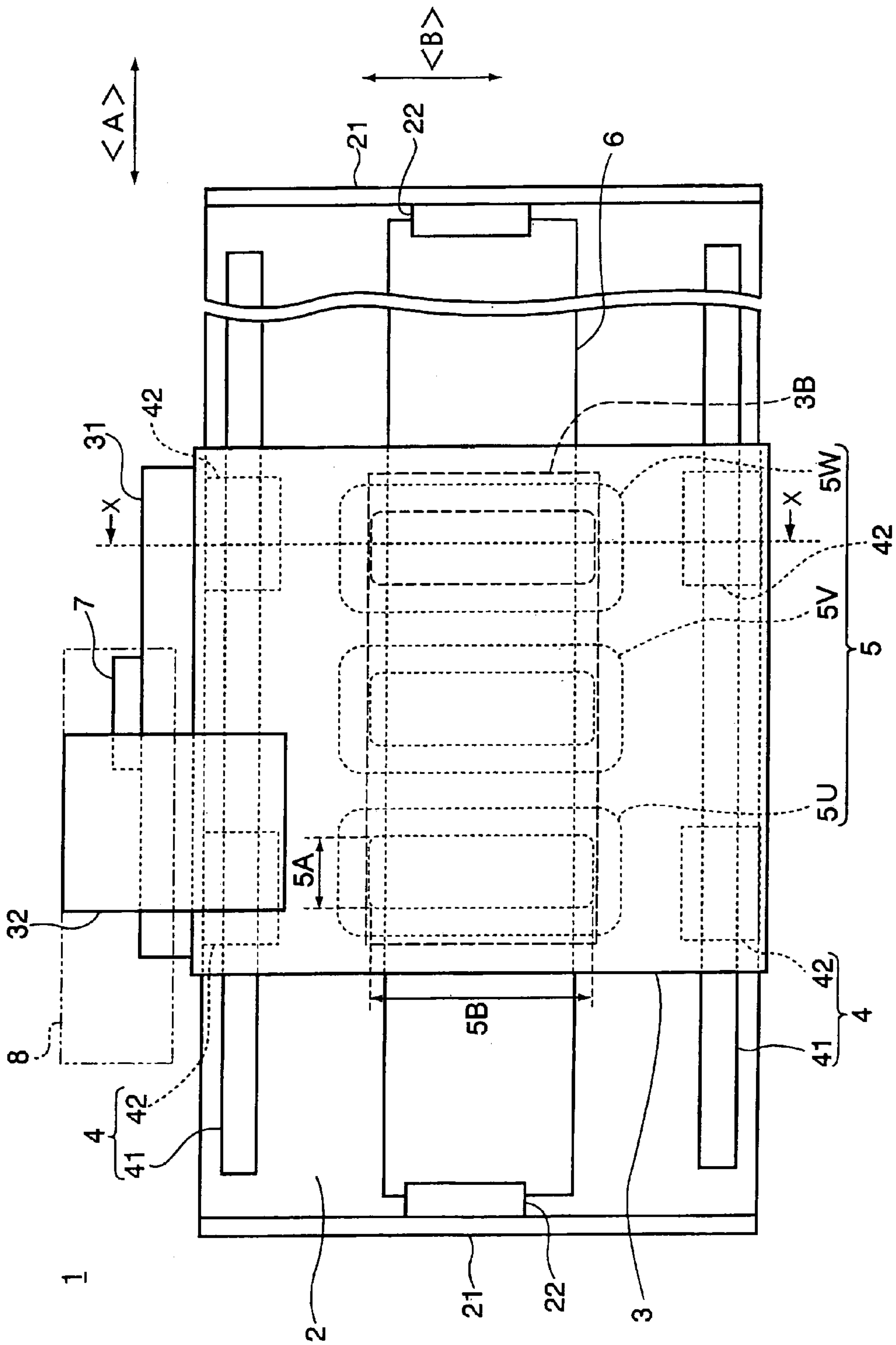
FIG. 1 is a plan view of a linear moving stage device according to a first embodiment.
Figure 2:
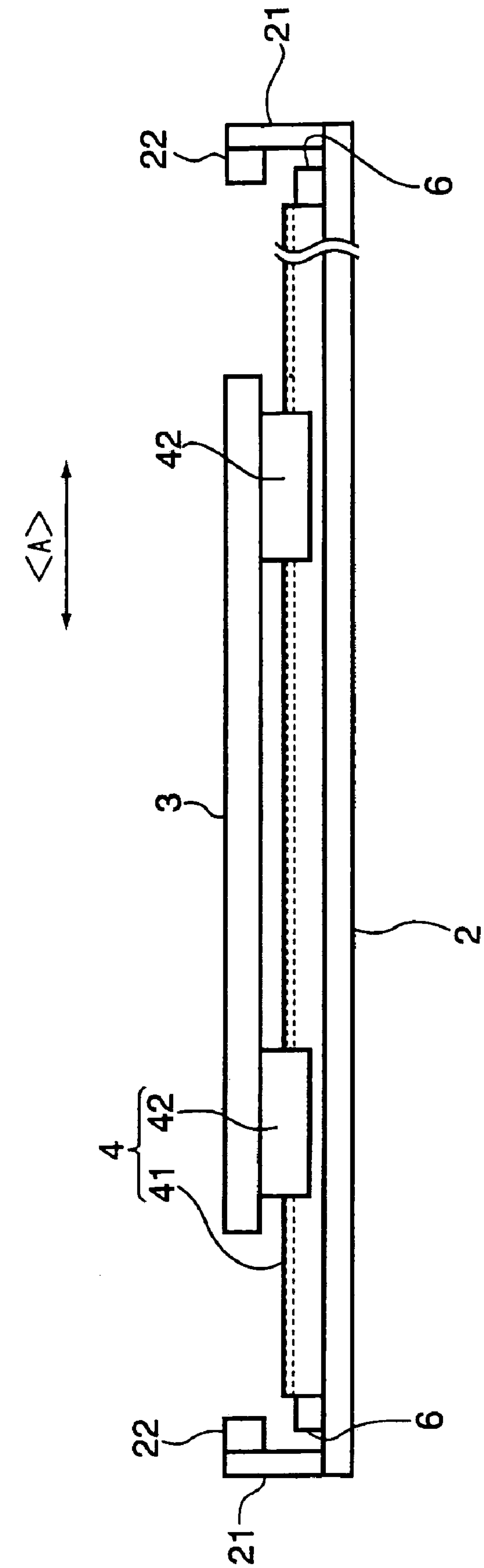
FIG. 2 is a view from the side of the linear moving stage device according to the first embodiment.

FIG. 1 is a plan view of a linear moving stage device according to a first embodiment. FIG. 2 is a view from the side in the stage moving direction A, and FIG. 3 is a sectional view along the line X-X in FIG. 1.

The linear moving stage device 1 includes a base 2, a stage 3 as a moving stage, a linear guide 4 provided between the base 2 and the stage 3, and a linear motor for giving thrust to the stage 3 to move linearly in a state of being supported on the base 2 by the linear guide 4. Note that the linear motor is generally composed of a coil, a permanent magnet and a yoke, etc. and the components will be explained later on.

Figure 3:
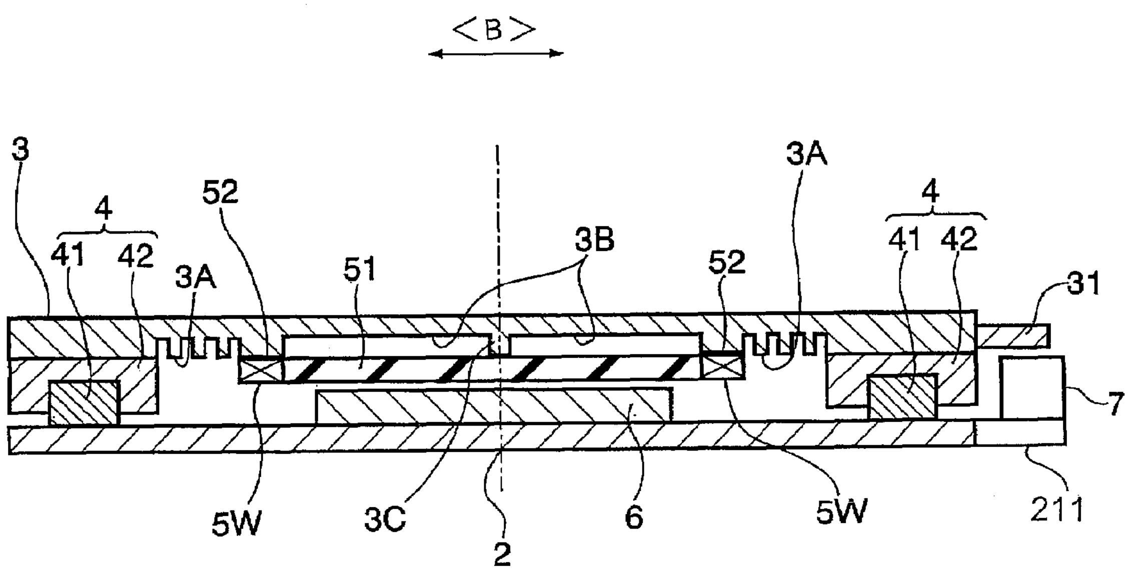
FIG. 3 is a sectional view along the line X-X in FIG. 1 according to the first embodiment.

As shown in FIG. 1 to FIG. 3, the base 2 has a flat plate shape longitudinal in the moving direction A of the stage 3.

The base 2 in the present embodiment is made by a magnetic material, such as a cold rolled steel sheet (SPCC) and low carbon steel, and serves also as a yoke. Therefore, a thickness of the base 2 is regulated to a value required as a yoke. A material and thickness of the base 2 are determined by also considering obtaining of rigidity for supporting a weight from the stage 3.

A permanent magnet 6 is fixed to an upper surface of the base 2. The permanent magnet 6 will be explained later on.

The stage 3 is supported by the linear guide 4 and linearly movable with respect to the base 2 and has an approximately flat plate shape facing to the base 2 as a whole. The upper surface of the stage 3 is a surface for loading a mounting member (not shown) to be linearly moved by the linear moving stage device 1. The stage 3 is formed by a light nonmagnetic material, such as aluminum, for trimming weight.

As shown in FIG. 1, a length in the moving direction A of the stage 3 is short enough comparing with that of the base 2, and a length in the width direction B perpendicular to the moving direction is regulated to be almost same as that of the base 2 here.

Note that a width of the stage 3 is not limited to this, but it is preferable to be almost same as that of the base 2 to secure a wide width of the upper surface for mounting a mounting member while reducing the whole size.

The linear guide 4 is composed of two guide rails 41 fixed by screws, etc. on both sides in the width direction of the base 2 and a plurality of slide units 42 fixed to a back surface of the table 3 facing to the base 2. In the case of the illustrated example, two slide units 42 are provided to one guide rail 41, and a total of four slide units 42 are fixed close to four corners of the stage back surface.

While the detailed illustration is omitted, conjugation portions of the guide rails 41 and those of the respective slide units 42 conjugate each other on both side surfaces, etc. of each guide rail 41 and configured not to come off easily.

Note that the conjugation portion of the slide unit 42 may be configured to have a tracking ball, etc. to reduce friction with the guide rail 41.

Also, attaching positions and the number of slide units 42 are not limited to those in the illustrated example, but the slide units 42 are preferably provided to be symmetric in the moving direction A and the width direction B of the table 3.

At both ends in the longitudinal direction of the base 2 near both ends of each of the guide rail 41, end members 21 are provided upright from the base 2. They enable to prevent the stage 3 from dropping from the guide rails 41 when setting the linear moving stage device 1 at a position of using it, or move of the stage 3 can be constrained even when the stage 3 guided by the guide rails 41 overruns due to a malfunction, etc.

Note that, while it is not an essential configuration, in the case of the illustrated example, a buffer portion 22 is provided on an upper portion of a side surface facing to the center side of the base of the end member 21, and move of the stage 3 is regulated while cushioning a shock by that.

As shown in FIG. 1 and FIG. 3, a scale locking plate 31 having a linear scale (not shown) formed on its lower surface is provided to one side surface of the stage 3, and a position detection sensor, such as an encoder 7, is provided at a position corresponding to the linear scale. The encoder 7 is fixed to a sensor locking plate 211 fixed to a side surface of the base 2 as shown in FIG. 3.

The encoder 7 is provided only one in FIG. 1 and FIG. 3, but it may be provided by more than one at predetermined intervals. By providing a plurality of encoders 7, in the case where the base length is long, a position of the stage 3 can be detected by at least one of them even if the stage 3 is at any position on the base. Alternately, when it is not necessary to detect the stage position, the encoder 7, the sensor locking plate 211 and scale locking plate 31 for attaching it are not necessary.

A three-phase coil is fixed on the back surface of the stage 3. The three-phase coil is composed of three coils 5U, 5V and 5W respectively having a U-phase, V-phase and W-phase arranged at even intervals along the moving direction A of the stage 3 as shown in FIG. 1.

Each of the coils is a flat (approximate track shape) wound coil arranged to be facing to a permanent magnet 6 and formed by severalfold wire wound by wet winding on an outer circumference of a thin plate shaped reinforcement member 51 made by a glass epoxy resin, etc. also serving as a coil bobbin as shown in FIG. 3. Here, the "wet winding" is a winding method of forming a predetermined coil shape by winding wire, keeping the coil shape by filling an epoxy resin, etc. between the wound wire and fixing the wound wire. Note that coreless wet winding or self fusing (self melting and mounting) winding wire may be also used.

Each of the coils 5U to 5W has, as shown in FIG. 1, a side portion 5A being longitudinal in the stage moving direction A and a portion 5B being longitudinal in the stage width direction B approximately perpendicular to the permanent magnet 6, and the portion 5B is a coil part contributing to thrust of the linear motor.

Each of the coils 5U to 5W is fixed to the back surface of the stage 3 by the two side portions 5A and corner parts on both ends thereof. For the fixing, a coil fixing film 52 is used as a thermally conductive fixing member, so that heat generated by the coils 5U to 5W is released to the stage 3 having a large thermal capacity as shown in FIG. 3. Note that instead of the coil fixing film 52, baking coating, electrodeposition coating or a thin resin plate may be used.

The coil fixing film 52 is a heat transfer insulation film made by a thin insulator for thermally fixing the coils 5U to 5W tightly to the stage 3. For example, it is formed by a Kapton film (a polyimide film "Kapton": "Kapton" is a trademark of DuPont), a polyester film, or a Teflon film (a fluorine resin "Teflon" is a trademark of DuPont), etc. and has sufficient insulation strength and a film thickness of preferably about 0.1 mm or thinner.

Baking coating may be either epoxy-based or melanin-based. As a thin resin plate, a glass epoxy cloth, etc. may be used.

The stage 3 thermally fixed tightly to the coils 5U to 5W is preferably provided with a fin to effectively release heat from the coils 5U to 5W. For example, as shown in FIG. 3, it is preferable to provide some fins 3A between the coil fixed part and a slide unit 42 fixed part on the stage back surface.

Note that if it is permissible to diminish flatness on the upper surface of the stage 3 in some degree, the heat releasing fins may be provided at any positions on an upper surface of the stage, for example, near the coil fixed part.

As shown in FIG. 3, on the back surface of the stage 3, to which the coil 5W is fixed, a recessed portion 3B is formed. In the example in FIG. 1, a size of the recessed portion 3B in the width direction B is approximately the same as a distance between inner edges of two side portions 5A of the coils, but it may be a little shorter than that. Also, a size in the stage moving direction A of the recessed portion 3B is preferably constrained, so that all of six linear portions 5B perpendicular to the stage moving direction A of the three coils 5U to 5W cross the recessed portion 3B. In this case, it is more preferable that ends of the recessed portion 3B in the stage moving direction A are sufficiently away from a linear portion 5B of the adjacent coil 5U or 5W, consequently, an electromagnetic field by the permanent magnet 6 and the coils 5U to 5W is not interfered by the recessed portion 3B.

In the present embodiment, by providing the recessed portion 3B, a space is formed between the coils 5U to 5W and reinforcement member 51 and the stage 3.

A depth of the recessed portion 3B, that is, a distance in the height direction from the coil fixed surface of the stage 3 to the surface facing to the coils in the recessed portion 3B is constrained so as not to cause an eddy current on the coil facing surface in the recessed portion 3B by the electromagnetic strength by the permanent magnetic 6 and the coils 5U to 5W or to scarcely contribute to raise a temperature of the stage 3 if generated.

To put in another way, the depth of the recessed portion 3B is regulated, so that the surface magnetic flux on the coil facing surface in the recessed portion 3B becomes 1000 gauss or lower when a maximum rated current flows to the coils 5U to 5W to obtain the maximum thrust of the stage.

Note that the coils 5U to 5W themselves have sufficient strength because they are provided with the reinforcement member 51 and formed by wet winding as explained above, however, to be furthermore firmly fixed to the stage 3 to prevent deformation, as shown in FIG. 3, it is preferable to provide a projection 3C at the center of the recessed portion 3B and fix the projection 3C to around the center of the reinforcement member 51. Note that a size of the projection 3C has to be regulated and a distance from the coils 5U to 5W, particularly from the linear portion 5B has to be secured sufficiently, so that the protrusion 3C does not interfere with the electromagnetic strength.

Figure 4:
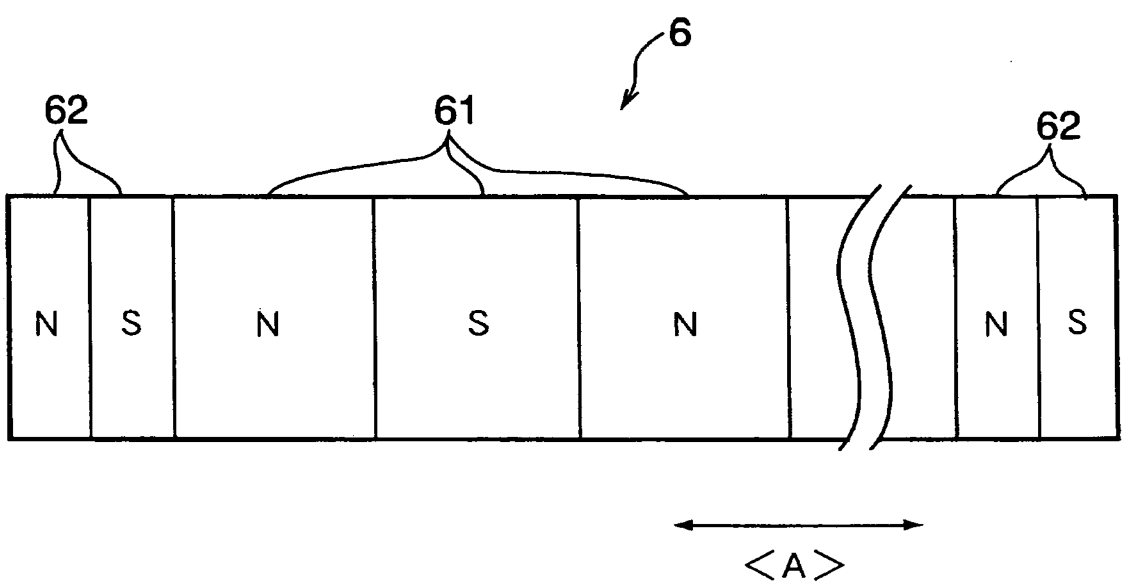
FIG. 4 is a view from the above of a permanent magnet according to the first and second embodiments.

FIG. 4 is a view from the above of the permanent magnet 6.

The permanent magnet 6, wherein a polarity of a part is different to that of the adjacent part, is magnetized in the longitudinal direction (stage moving direction A) when seeing from the above as shown in FIG. 4, and a magnet flux from the respective unit magnets 61 formed by the magnetization does not grow too high and shortcut to an adjacent unit magnet 61 having a different magnetic polarity.

Note that at both ends in the longitudinal direction of the permanent magnet 6, magnetic flux extraction auxiliary magnets 62 are provided for equalize magnetic fields at the ends of the magnet with that of other parts.

Because of a demand for a thinner body of reducing a height of the linear moving stage device 1, the permanent magnet 6 is preferably made as thin as possible. Note that the thickness of the permanent magnet 6 is determined to a predetermined value in accordance with necessary intensity of the magnetic field. The magnetic field intensity here is that at positions where the coils 5U to 5W are arranged by leaving a necessary space from the permanent magnet 6.

Also, the narrower the pitches of a negative pole and a positive pole formed to be next to each other by the unit magnets 61, the more the height of the magnetic field is constricted. At this time, the height of the magnetic field is regulated to supply the magnetic field in the vertical direction (normal line direction) with respect to the coils 5U to 5W but not to affect the coil facing surface (the upper surface in FIG. 3) in the recessed portion 3B by the electromagnetic strength by the coils 5U to 5W and the permanent magnet 6.

Furthermore, pitches of the positive pole and the negative pole by the unit magnets 61 are regulated to a value for obtaining smooth linear thrust in relation to predetermined pitches of the coils 5U to 5W.

As explained above, the pitches of the positive pole and negative pole and the magnetic field intensity by the unit magnets 61 are determined by analyzing the magnetic field by considering a distance to the coils 5U to 5W and pitches of arranging them, so that sufficient magnetic field intensity is obtained at the coil part even if the entire body is made thin and the recessed portion 3B of the stage 3 is not adversely affected by an eddy current when in operation.

Wirings drawn from both ends of the respective winding of the coils 5U to 5W and wiring from the encoder 7 are insulated from one another, pass through a cable duct 8 and connected to a not shown drive circuit. As shown in FIG. 1, a cable support plate 32 for supporting the cable duct 8 is fixed to one end side in the width direction of the upper surface of the table 3 by screws, etc.

When a three-phase AC current is supplied from the not shown drive circuit to the coils 5U to 5W, a Lorentz force by a magnetic strength and electric strength acts on the coils 5U to 5W and becomes thrust of the linear motor. As a result, the stage 3 fixed to the coils 5U to 5W moves linearly by being supported by the linear guide 4. At this time, a position of the stage 3 is detected by the encoder 7, and the three-phase AC current is controlled by the drive circuit when the detection result is given.

The linear motor and the linear moving stage device 1 using the same in the present embodiment have advantages below comparing with the linear motor having the configuration of the related art shown in FIG. 10 and FIG. 11.

As shown in FIG. 3, the linear motor for obtaining thrust is composed of one single-layer coil (any one of the three-phase coils 5U to 5W), one permanent magnet 6 and a base 2 also serving as a yoke when seen in the thickness direction, so that the entire body is made thin. Also, it is not necessary to provide two yokes on both sides of the coil (any one of the three-phase coils 5U to 5W) and the coils 5U to 5W are fixed to the stage 3 via the coil fixing film 52, so that the entire body is made thin also from that point.

Also, the configuration of the linear motor is simple and the number of parts is small.

Also, according to the configuration, the stage 3 is made by a nonmagnetic material, so that no magnetic attractive force acts between the stage 3, permanent magnet 6 and the base 2. Therefore, the stage 3 and the base 2 have no limits in mechanical strength due to the magnetic attractive force, and a thinner body can be attained by that much.

Note that since the base 2 also serves as a yoke, a thickness of not causing magnetic saturation and mechanical strength for supporting the stage 3 by the linear guide 4 are required, but it is not necessary to consider an affect by a magnetic attractive force, so that the degree of freedom is high in selecting the material and thickness.

According to the configuration, a Lorentz force determined by a product of a magnetic flux in the normal line direction of the permanent magnet 6 and a coil current is generated and becomes thrust of linear movement of the stage 3.

At this time, since the coils 5U to 5W are fixed to the stage 3 via the coil fixing film 52 having a high heat transfer performance, a distance from the thrust generating point (coil position) to the thrust applying point (stage position) can be widely shortened. Therefore, couple of forces liable to cause a decline of control performance can be also largely suppressed.

Figure 10:
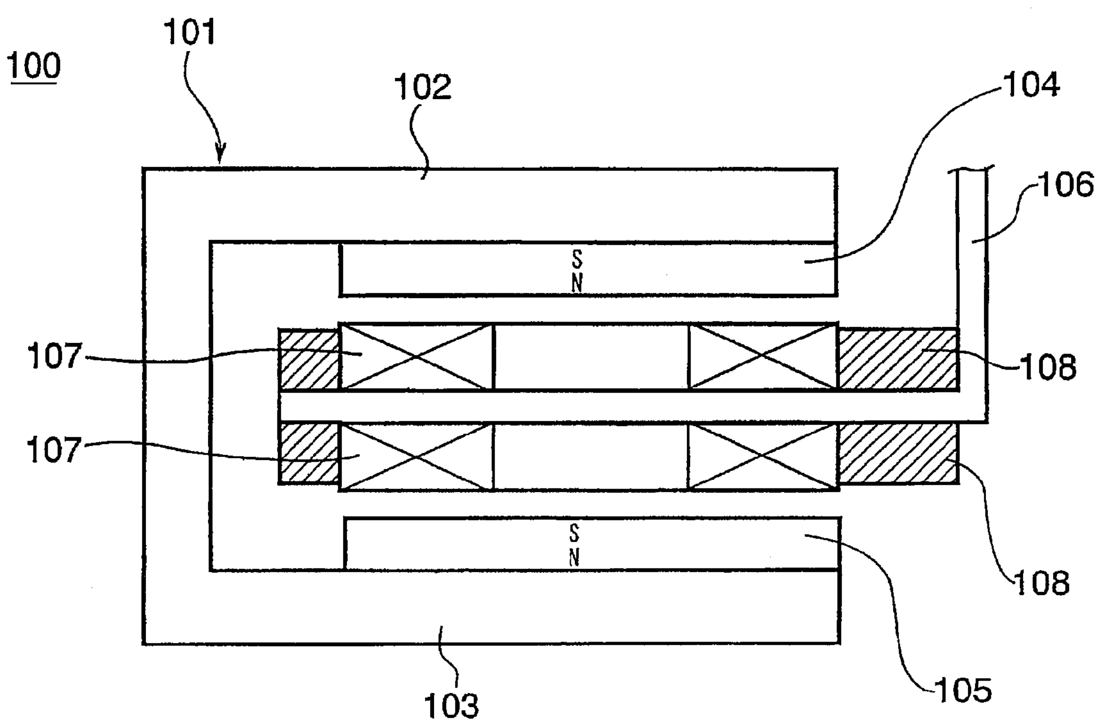
FIG. 10 is a view of the configuration seen from a section perpendicular to a longitudinal direction (movable direction) of a coreless linear motor as the related art.

Particularly, because the thrust generated on the coils 5U to 5W side is transmitted directly to the stage, couple of forces is remarkably small and mechanical vibration is largely suppressed when comparing with those in the case of FIG. 10, where thrust is transmitted through the bent movable body attaching plate 106 having poor rigidity Also, in the present embodiment, almost all parts are arranged symmetrically about the center axis on the section in the width direction shown in FIG. 3.

Therefore, a load of the stage 3 as the thrust applying point and a mounting member (not shown) thereon is imposed approximately vertically to the thrust generating point (coil position). Therefore, couple of forces is not generated in the horizontal direction (yawing direction) of the stage 3 when moving the stage.

Therefore, when comparing with the linear motor of the related art shown in FIG. 10, a dynamic disturbance at the time of moving the stage is small, consequently, the control performance is improved.

Figure 11:
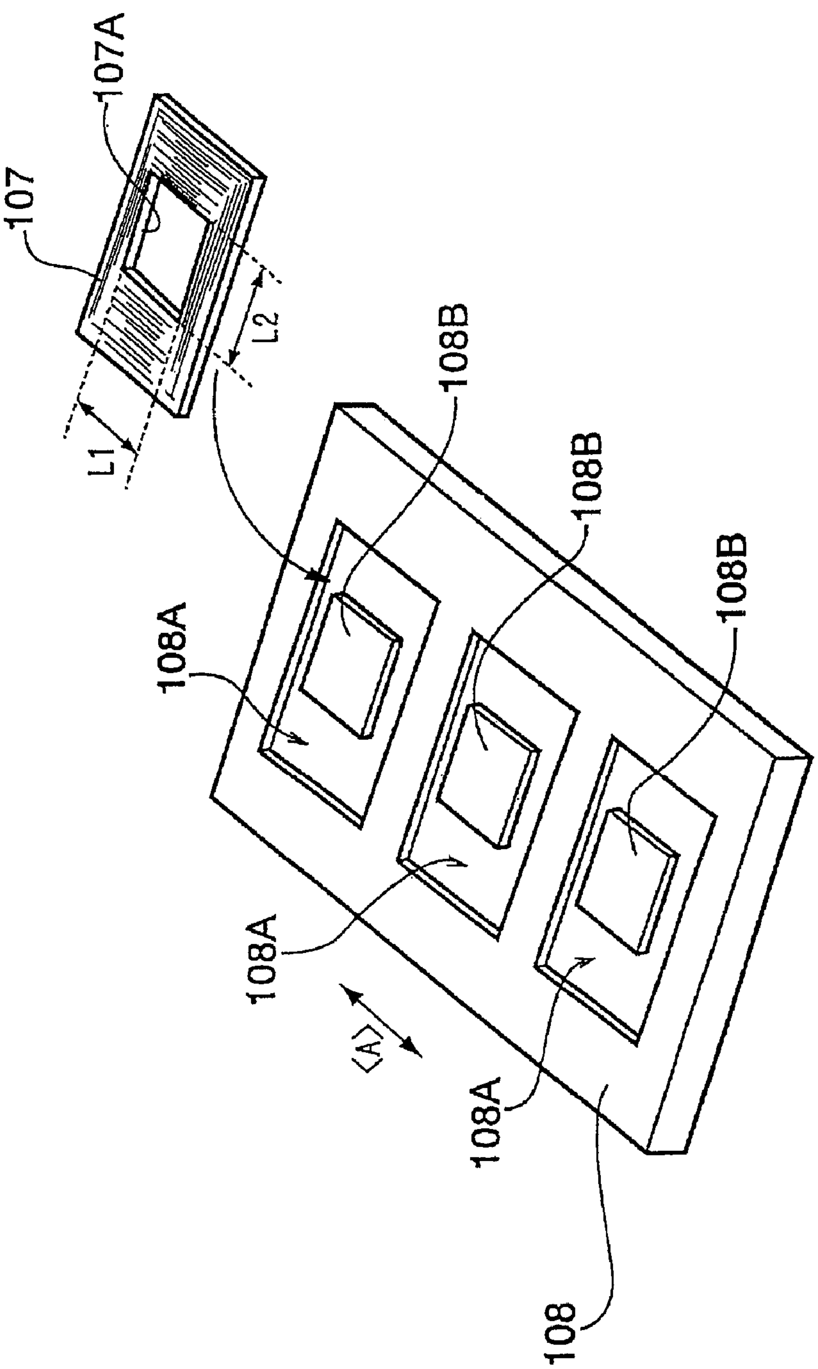
FIG. 11 is a perspective view of a reinforcement member to be fixed to a movable body attaching plate and a coil to be fixed by being fitted in the reinforcement member.

In the case of the related art shown in FIG. 11, most of surfaces except for the magnet facing surface are enclosed by a nonmagnetic material having a poor heat radiating property.

When the coils are enclosed by the reinforcement member made by a nonmagnetic member, the efficiency declines because the nonmagnetic material has high magnetic resistance and weakens the magnetization.

On the other hand, in the present embodiment, less surfaces are enclosed by a nonmagnetic material, such as a resin of the coils 5U to 5W.

Namely, in the present embodiment, a nonmagnetic material (glass epoxy resin) is used for the reinforcement member 51 as a coil bobbin, etc. in the interest of securing the strength, however, when removing necessary parts for fixing the coils 5U to 5W, much of other coil surfaces are exposed to the air.

Accordingly, the heat radiation effect is enhanced and a value of the current flowing to the coils 5U to 5W for obtaining desired thrust may be smaller comparing with that in the related art. Also, since the magnetic strength generated by the coils 5U to 5W is not weakened much, the value of the current flowing to the coils may be made smaller in terms thereof.

Furthermore, when the heat radiating property of the coils 5U to 5W is good, it becomes unnecessary to compensate a declined amount of the efficiency, which declines as the heat radiating property declines, and improve the intensity of the magnetic field by making the thickness of the permanent magnetic 6 thick to obtain desired thrust; which contributes to attain a thin body.

When comparing with the configuration shown in FIG. 10, wherein two-layer coils are superimposed to obtain thrust by a magnetic action by upper and lower magnets, there is an advantage that the eigenfrequency can be widely made high. When the eigenfrequency is high, vibration having a wide amplitude to hinder the control performance is hardly generated, consequently, smooth linear move becomes possible and the control performance improves.

Also, a heavy iron-based material is used little and a light material, such as aluminum, is mainly used, so that weight of the stage 3 is particularly trimmed. This combined with the simple configuration of the linear motor and the small number of parts, the control performance of the linear moving stage device 1 is dramatically improved.

Second Embodiment

Figure 5:
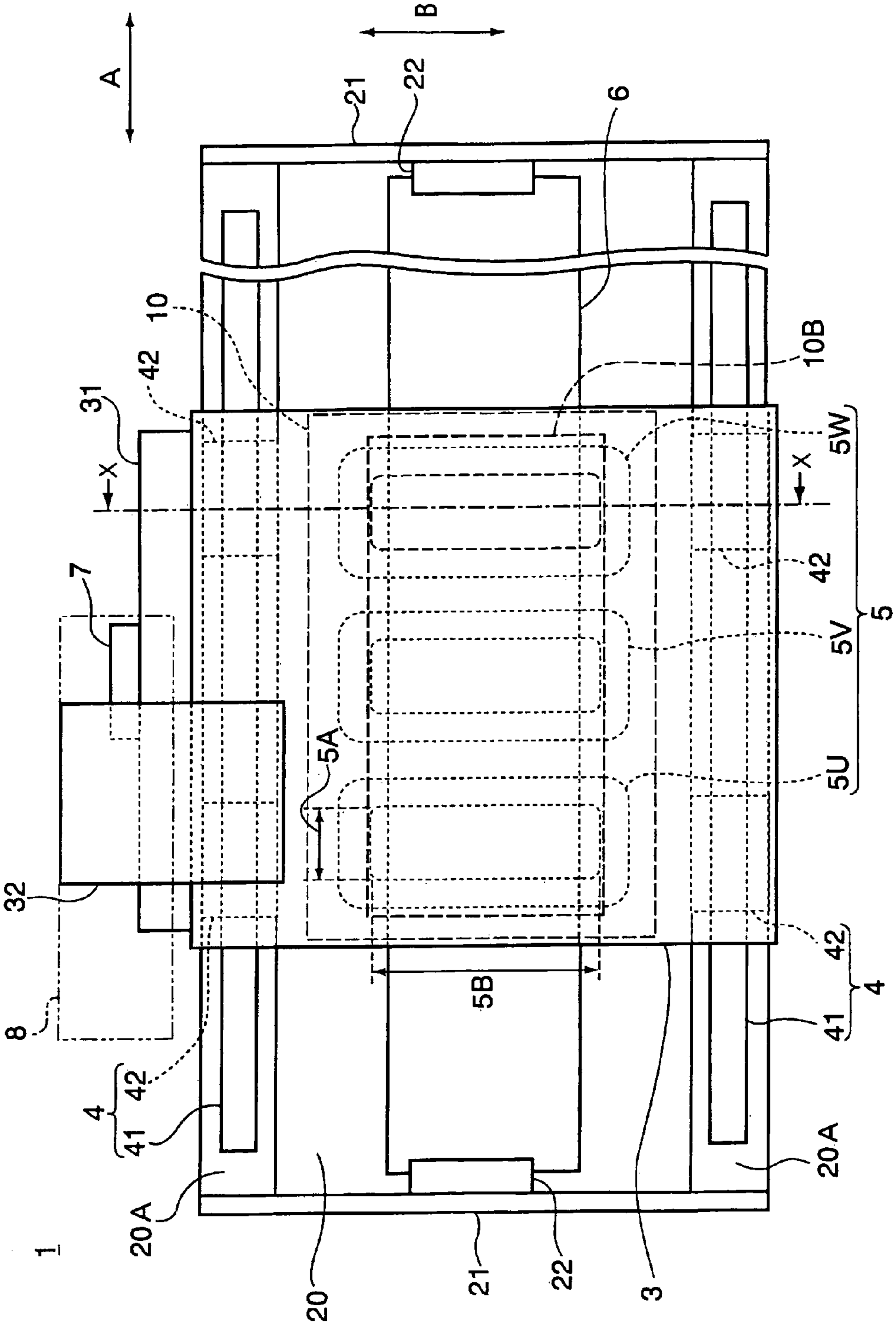
FIG. 5 is a plan view of a linear moving stage device according to a second embodiment.
Figure 6:
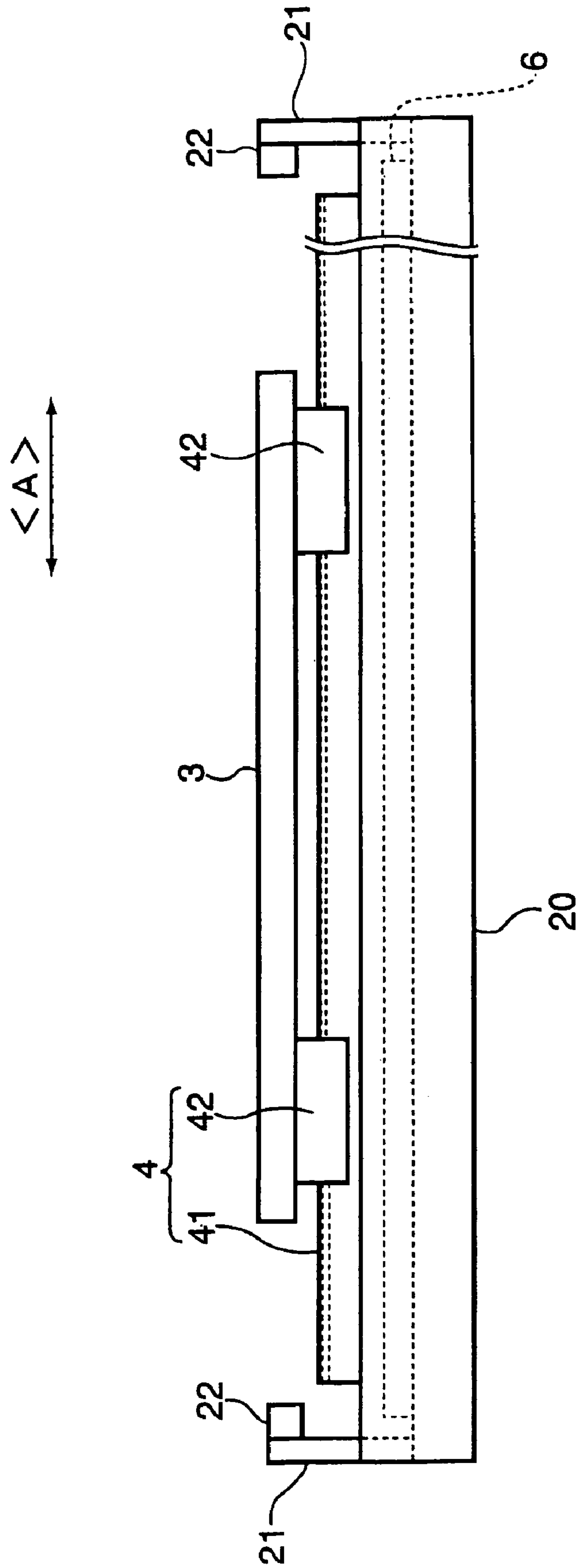
FIG. 6 is a view from the side of a linear moving stage device according to the second embodiment.
Figure 7:
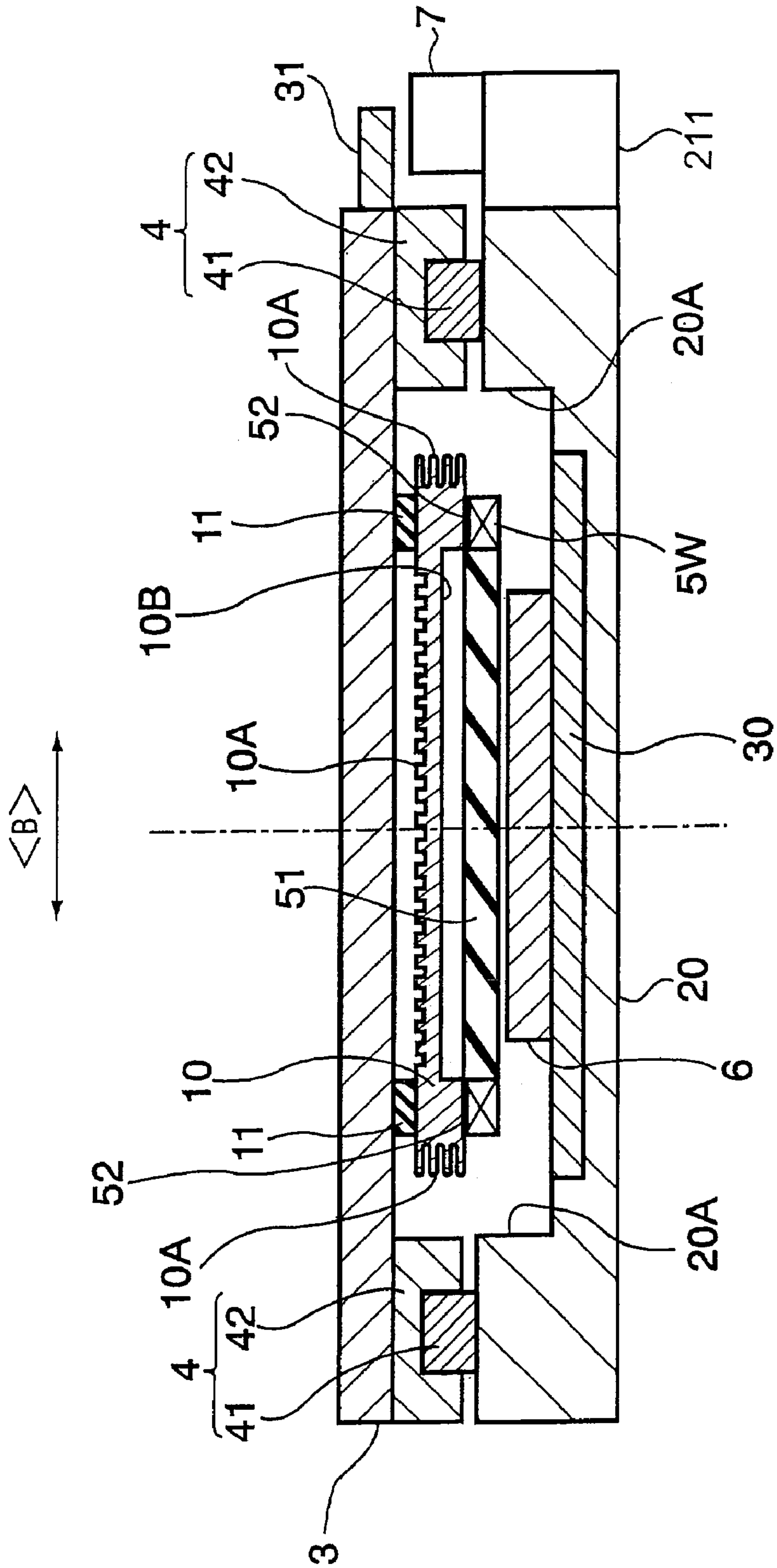
FIG. 7 is a sectional view along the line X-X in FIG. 5 according to the second embodiment.

FIG. 5 is a plan view of a linear moving stage device according to a second embodiment. FIG. 6 is a view from the side in the stage moving direction, and FIG. 7 is a sectional view along the line X-X in FIG. 5.

What the linear moving stage device 1 of the present embodiment is largely different from that in the first embodiment is the shape of the base 20 and the heat radiating configuration of the yoke 30 and coils (particularly, the thermal radiation plate 10 is newly provided). This point will be explained in order below. Note that other parts are basically the same as those in the first embodiment, so that the same reference numbers are given in the drawings and the explanation will be omitted.

The base 20 in the present embodiment is composed of a light nonmagnetic material, such as aluminum, to trim weight of the entire body and formed by embedding the yoke 30 therein.

Because the coil thermal radiation plate 10 of the present embodiment has the thermal radiation plate 10, a space for arranging it becomes necessary. To obtain the space for arranging the thermal radiation plate 10 and the permanent magnet 6, both end portions 20A in the width direction of the base are made thick. As shown in FIG. 7, the base 20 has a recessed-shaped section as a whole.

On a thin portion inside the both ends 20A in the width direction of the base 20, the yoke 30 is firmly fixed by being embedded. At this time, since rigidity of the yoke 30 is high, necessary rigidity on this portion is obtained.

The yoke 30 is formed by a single or a plurality of layers of a thin SPCC material and subjected to precise press, and a magnetic flux of the magnet can be made small by narrowing pitches of the positive pole and negative pole of the magnet, so that it can be made thin. Note that the yoke 30 may be formed by other low-carbon steel.

The permanent magnet 6 is fixed to the yoke 30. A material, shape and magnetization of the permanent magnet 6 are the same as those in the first embodiment (refer to FIG. 4).

The thermal radiation plate 10 is a member for thermal radiation provided between three-phase coils 5U to 5W and the stage 3. The thermal radiation plate 10 is fixed to the stage back surface by supporting members 11, which also serves as spacers (hereinafter, referred to as spacers), in a state of thermally blocking the stage 3 and the linear guide 4.

The spacer 11 has a thickness for obtaining a space for the stage 3 and the thermal radiation plate 10 and a size and material required to secure the fixing strength and is, for example, formed by a thermal insulator so as not to transfer heat from the coils 5U to 5W to the stage 3. Also, since the spacer 11 has high rigidity, the stage 3 and the thermal radiation plate 10 are firmly fixed. As a material of the spacer 11 functioning as such, ceramic or a glass epoxy resin, etc. are preferable.

On a surface of the thermal radiation plate 10 on the permanent magnet side, the coils 5U to 5W having the same shape as that in the first embodiment are thermally fixed tightly via the coil fixing film 52 as a heat transfer adhesive material.

A necessary size, etc. of the thermal radiation plate 10 is determined in accordance with an extent of a temperature of the coils 5U to 5W rising when used repeatedly. Also, there is a demand for limiting the space for holding the thermal radiation plate 10 and, furthermore, trimming the weight as much as possible, so that the size, shape and material of the thermal radiation plate 10 are determined by taking them into account.

Generally, it is preferable to increase the thermal capacity and surface area within a permissible range and to form the thermal radiation plate 10 by a light material to trim weight of the entire body. In the present embodiment, the thermal radiation plate 10 is formed by a light material having a relatively high thermal conductivity, such as aluminum.

In the first embodiment, the recessed portion 3B was formed on the stage 3, but a recessed portion 10B is formed on the thermal radiation plate 10 in the present embodiment.

A relative position of the recessed portion 10B with respect to positions of fixing the coils 5U to 5W and the size on the plan view are the same as those in the first embodiment, and an object of providing the recessed portion and the depth are also substantially in common with those in the first embodiment.

Namely, the recessed portion 10B is for forming a space between the coils 5U to 5W, the reinforcement member 51 and the thermal radiation plate 10, and the depth is constrained so as not to cause an eddy current on the coil facing surface in the recessed portion 10B by the electromagnetic strength by the permanent magnetic 6 and the coils 5U to 5W or to scarcely contribute to raise a temperature of the thermal radiation plate 10 if generated.

To put in another way, the depth of the recessed portion 10B is regulated, so that the surface magnetic flux on the coil facing surface in the recessed portion 10B becomes 1000 gauss or lower when a maximum rated current flows to the coils 5U to 5W to obtain the maximum thrust of the stage.

The thermal radiation plate 10 is preferably provided with a fin for enhancing the thermal radiation effect. For example, as shown in FIG. 7, it is preferable to provide some fins 10A on the surface of the thermal radiation plate 10 facing to the stage or around the coil fixed part. Note that the fin may be provided by the number of 1.

When focusing on an increase of the thermal capacity and surface area in the thermal radiation configuration as explained above, the thermal radiation effect can be furthermore enhanced by making the thermal radiation plate 10 thick.

Note that, in the present embodiment, the thermal conductivity of the thermal radiation plate 10 itself is high, and an air cooling effect is obtained by a space between the thermal radiation plate 10 and the coils 5U to 5W formed by the recessed portion 10B and, moreover, a space between the thermal radiation plate 10 and the stage 3 formed by the spacers 11, so that sufficient thermal radiation is possible even if the thermal radiation plate 10 is made thin.

According to the linear moving stage device according to the second embodiment, the same effects as those in the first embodiment can be obtained.

Namely, when comparing with the configuration of the related art, a thin and light body can be attained, there is no limit in strength because a magnetic attracting force does not act, a distance from a thrust generation point to thrust applying point is short to suppress generation of couple of forces, weight balance is preferable by the symmetric configuration to prevent horizontal vibration, and the eigenfrequency is high to enable smooth linear move in the present embodiment. As a result, the control performance is dramatically improved.

Furthermore, there are advantages explained below when comparing with the first embodiment.

In the first embodiment, the base 2 also serves as a yoke, so that there are limits on the plate thickness and the rigidity, while there is no limit in the base 20 of the second embodiment.

Therefore, in the second embodiment, rigidity of the entire base can be controlled by changing the material and section shape of the base 20. Particularly, in the case of a linear moving stage device, the rigidity of the base 20 has to be optimized as explained below for smooth movement.

The stage 3 somewhat bends when a very heavy object is put on the stage 3 in some cases in a state where the stage 3 is movably supported by guide rails 41. In that case, if the rigidity of the base 20 side is too high, a force in the horizontal direction is applied to the linear guide 4 to adversely increase the friction resistance, so that mechanical performance as a linear moving stage device declines and a value of the current flowing to the coils 5U to 5W increases.

At this time, if the rigidity is held down to allow the base 20 side to bend together to a certain extent, an increase of friction, a decline of mechanical performance thereby, and an increase of the current value as above can be prevented.

Also, in the second embodiment, by changing a height of a thick portion 20A of the base 20 on the section in FIG. 7, the thrust generating point (around coil fixed position), a center of gravity of the movable body (an assembled body of the stage 3, the thermal radiation plate 10, coils and slide units 42) and a bearing of the linear guide 4 can be substantially lined up at positions in the vertical direction. This means that "a thrust generating position", "a thrust acting position" and "a supporting position of interaction of the thrust" are balanced in terms of the positions. Accordingly, the linear moving stage device of the second embodiment realizes a stable mechanism in terms of structural mechanics, wherein couple of forces caused by imbalance of the three positions is extremely small.

From the above, it is possible to realize a linear moving stage device, wherein control performance is widely improved comparing with that in the linear motor having the configuration of the related art, and structural advantages can be furthermore obtained even when comparing with those in the first embodiment, so that the control performance is improved by that much.

Note that the case of applying the linear motor of the present invention to a linear moving stage device was explained above, but the linear motor of the present invention can be applied to an X-Y table device capable of attaining two-axis moving.

In the X-Y table device, a first linear moving stage portion moving along one of the X-axis and Y-axis and the configuration of fixing a second linear moving stage portion linearly moving in the perpendicular direction to a stage of the first linear moving stage portion can be applied. In that case, a stage of the second linear moving stage portion becomes an X-Y table for loading an object to be moved finally. At this time, the first and second linear moving stage portions are respectively formed to have the configuration explained above, to which the present invention is applied.

In the X-Y table device configured as above, the first and second linear moving stage portions are made thin, so that it is possible to realize a compact and thin device as a whole.

Also, in the X-Y table device configured as above, a larger load is imposed to the first linear moving stage portion arranged at a lower position. However, since the weight is trimmed in the linear moving stage portions, the load is reduced by that much.

Also, vibration (dynamic disturbance) from other linear moving stage portion hardly affects to each other and the control performance is high due to a number of structural advantages explained above: which are that couple of forces in the yawing direction is hardly applied because a force is applied from virtually immediately above to the thrust generating point, it has a symmetric configuration about a vertical surface passing through the moving axis and, furthermore, it is structurally stable because a center of gravity, etc. are balanced in terms of positions.

Furthermore, the first and second linear moving stage portions are thin, and there is an advantage that an eigenfrequency in the direction of pitching of the first linear moving stage portion can be made widely higher comparing with that in the configuration in FIG. 10, wherein coils are superimposed to obtain thrust by a magnetic action by upper and lower magnets. When the eigenfrequency is high, vibration having a wide amplitude to hinder the control performance is hardly generated, consequently, smooth linear movement becomes possible and the control performance improves.

Third Embodiment

In the above first and second embodiments, the stage 3 or the thermal radiation plate 10 may be provided with a path of a cooling medium of a gas or liquid, for example, the air or water, etc. The present embodiment is the case of providing the path.

Figure 8A:
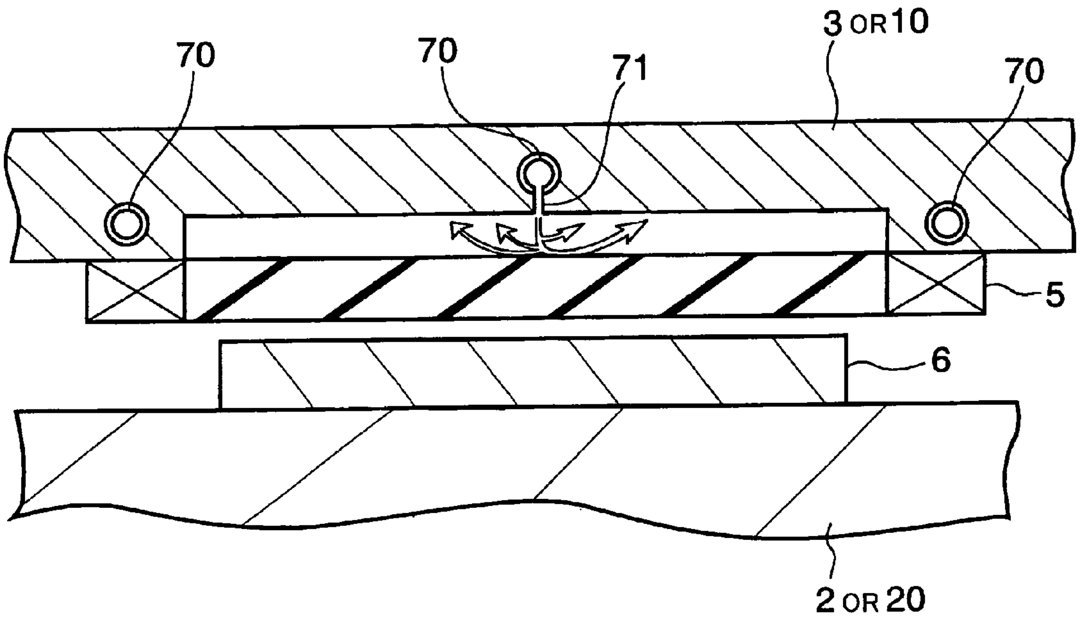
FIG. 8A is a sectional view of a linear moving stage device according to a third embodiment.

FIG. 8A is a sectional view of a linear moving stage device according to a third embodiment.

Figure 8B:
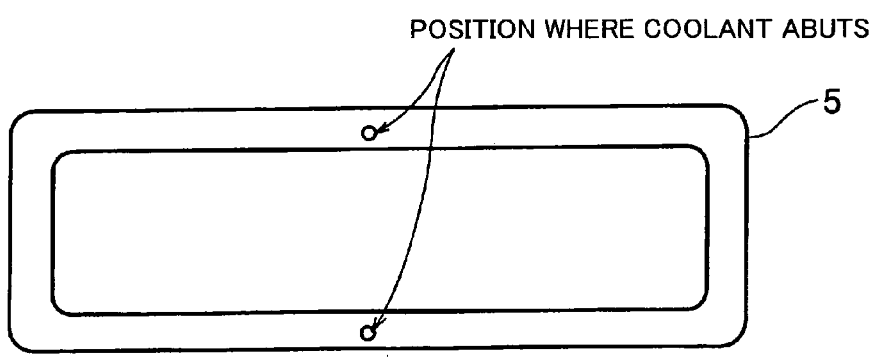
FIG. 8B is a plan view of a coil showing a position of blowing a cooling gas.

In the present embodiment, a tube composing a path 70 is provided inside the stage 3 or the thermal radiation plate 10. A position and the number of the path 70 may be freely determined. In the present embodiment, two paths 70 are provided near the part for fixing the coil 5 and one path 70 is provided near the center of the coil 5. Furthermore preferably, an outlet 71 of a cooling gas for cooling by blowing the gas directly to the coil 5 is provided to the path 70 at the center. The number per one coil and position of the cooling gas outlet 71 may be freely determined and, in the present embodiment, the cooling gas can be blown to two positions per one coil as shown in FIG. 8B.

Therefore, the cooling medium of the center path 70 has to be a gas, but a liquid may flow in the paths 70 near the coil fixed positions.

In the present embodiment, since the cooling medium paths 70 are provided in the stage 30 or the thermal radiation plate 10, heat transferred to the stage 30 or the thermal radiation plate 10 from the coil 5 is easily discharged to the outside via the cooling medium. As a result, temperature rising of the coil 5 is suppressed and the control performance of the linear moving stage device is furthermore improved comparing with that in the first or second embodiment.

When the cooling gas outlet 71 is provided, the effect of cooling the coil 5 can be furthermore enhanced.

Note that as a result that highly effective thermal radiation as such is given, it becomes easy to omit the thermal radiation plate 10, and there is an advantage that this leads to an improvement of entire rigidity.

Fourth Embodiment

In the above first to third embodiments, a member on the movable unit side close to the coil 5, for example, the stage 3 or the thermal radiation plate 10 may be provided with a fin for supporting the reinforcement member 51 of the coil 5 and functioning to release heat from the reinforcement member 51. The present embodiment is the case of providing the fin.

Figure 9:
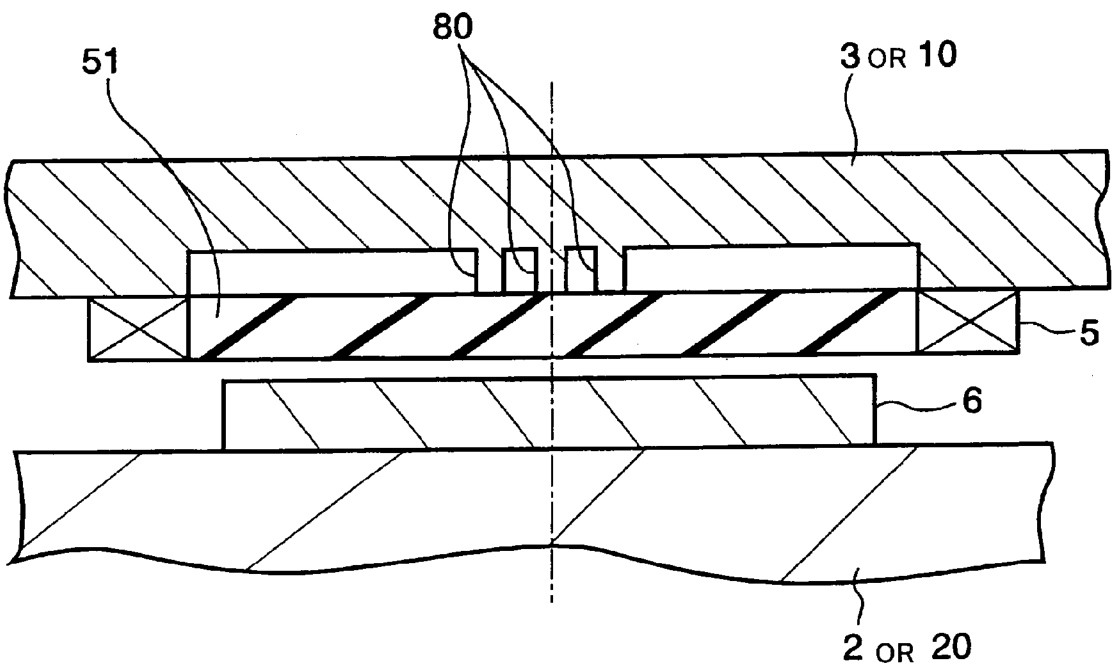
FIG. 9 is a sectional view of a linear moving stage device according to a fourth embodiment.

FIG. 9 is a sectional view of a linear moving stage device according to a fourth embodiment.

In the illustrated example, three fins 80 are provided in the direction of the illustrated section. The number and shape may be freely determined, but an end face of the fin 80 has to contact the reinforcement member 51 at the center of the coil 5. Preferably, while not illustrated, a layer made by the same material as that of the coil fixing film 52 or other baking coating, etc. is provided between the end faces of the fins 80 and the reinforcement member 51, so that the both are thermally and mechanically fixed tightly thereby.

Furthermore preferably, the number, position and size of the fin 80 are determined so as not to affect an eddy current. Note that when generation of eddy current can be suppressed sufficiently, stainless steel (SUS plate) may be used other than aluminum, etc. as a material of the stage 3 or the thermal radiation plate 10.

In the present embodiment, the thermal radiation effect of the coil 5 is improved and the coil 5 is furthermore tightly fixed, so that the control performance and rigidity of the linear moving stage device are improved comparing with those in the case of not providing the fin 80.

It should be understood by those skilled in the art that various modifications, combinations, sub-combinations and alternations may occur depending on design requirements and other factors insofar as they are within the scope of the appended claims or the equivalents thereof.

What is claimed is:

1. A linear motor for providing thrust to a movable unit capable of linearly moving freely in one direction with respect to a stator, comprising:
- a plurality of permanent magnets arranged on the stator side by lining up a positive pole and a negative pole in said one direction; and
- a plurality of flat shaped coils arranged along the arrangement direction of permanent magnets and fixed to said movable unit side so as to face the permanent magnets at an electromagnetic gap;
- wherein said movable unit is made of nonmagnetic and thermal conductive material and has a recessed portion at a surface facing the plurality of flat shaped coils to define an air gap between the coils and the movable unit,
- wherein each flat shaped coil comprises a plate shaped reinforcement member of nonmagnetic material and a flat coil member wound around the reinforcement member;
- wherein two side portions of each coil member of each flat shaped coil are substantially fixed to non-recessed portions of the movable unit by thermal conductive fixing member; and
- wherein a depth of the recessed portion of the movable unit is restricted, so that a surface magnetic flux on said facing surface generated by a magnetic field of facing magnets becomes 1000 gauss or lower.

2. The linear motor as set forth in claim 1, wherein the movable unit is a thermal radiation plate comprising a light nonmagnetic metal.

3. The linear motor as set forth in claim 1, wherein a fin is formed on said thermal radiation plate.

4. The linear motor as set forth in claim 3, wherein said fin is provided near the center of said coils in said recessed portion, and a bobbin member of the coil is fixed to an end surface of the fin.

5. The linear motor as set forth in claim 1, wherein a path of a cooling medium is formed in the member on the movable unit side, to which said coils are fixed to direct the cooling medium to the coils.

6. The linear motor as set forth in claim 5, wherein an outlet for blowing a gas as said cooling medium against said coils is provided to said path of the cooling medium.

7. A linear moving stage device comprising a base, a stage of nonmagnetic material and built to be able to linearly move freely in one direction with respect to the base, and a linear motor that provides thrust in said one direction to the stage, said linear motor comprising:
- a plurality of permanent magnet arranged on the base by lining up a positive pole and a negative pole in said one direction, and
- a plurality of flat shaped coils arranged along the arrangement direction of permanent magnets and fixed as armatures to said stage so as to face the permanent magnets at an electromagnetic gap;
- wherein the stage is made of nonmagnetic and thermal conductive material and has a recessed portion at a surface facing the plurality of flat shaped coils to define an air gap between the coils and the stage;

wherein each flat shaped coil comprises a plate shaped reinforcement member of nonmagnetic material and a flat coil member wound, around the reinforcement member, wherein two side portions of each coil member of each flat shaped coil are substantially fixed to non-recessed portion of the stage by thermal conductive fixing member, and wherein a depth of the recessed portion of the stage is restricted, so that a surface magnetic flux on said facing surface generated by a magnetic field of facing magnets becomes 1000 gauss or lower.

8. The linear moving stage device as set forth in claim 7, wherein:

a thermal radiation plate is fixed to said stage via a spacer formed by a thermal insulator; and said coils are fixed to the thermal radiation plate surface around the recessed portion via a thermally conductive fixing member.

9. The linear moving stage device as set forth in claim 8, wherein a path of a cooling medium is formed in said thermal radiation plate.

10. The linear moving stage device as set forth in claim 9, wherein an outlet for blowing a gas as said cooling medium against said coils is provided to said path of the cooling medium.

11. The linear moving stage device as set forth in claim 7, wherein a fin is formed on a surface on the stage side of said thermal radiation plate.

12. The linear moving stage device as set forth in claim 11, wherein said fin is provided near the center of said coils in said recessed portion, and a bobbin member of the coil is fixed to an end surface of the fin.

13. The linear moving stage device as set forth in claim 7, wherein a path of a cooling medium is formed in said stage to direct the cooling medium to the coils.

14. The linear moving stage device as set forth in claim 13, wherein an outlet for blowing a gas as said cooling medium against said coils is provided to said path of the cooling medium.

* * * * *